United States Patent
Qian et al.

(10) Patent No.: US 8,063,465 B2
(45) Date of Patent: Nov. 22, 2011

(54) BACKSIDE ILLUMINATED IMAGING SENSOR WITH VERTICAL PIXEL SENSOR

(75) Inventors: Yin Qian, Milpitas, CA (US); Hsin-Chih Tai, Cupertino, CA (US); Duli Mao, Sunnyvale, CA (US); Vincent Venezia, Sunnyvale, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 299 days.

(21) Appl. No.: 12/260,019

(22) Filed: Oct. 28, 2008

(65) Prior Publication Data

US 2009/0200626 A1  Aug. 13, 2009

Related U.S. Application Data

(60) Provisional application No. 61/027,373, filed on Feb. 8, 2008.

(51) Int. Cl.
*H01L 31/00* (2006.01)
*H01L 31/0232* (2006.01)

(52) U.S. Cl. .......... 257/460; 257/437; 257/E31.127

(58) Field of Classification Search .......... 257/440, 257/437, 460, E31.127, E31.121, 447
See application file for complete search history.

(56) References Cited

U.S. PATENT DOCUMENTS

| | | | |
|---|---|---|---|
| 5,965,875 A | 10/1999 | Merrill | |
| 6,534,759 B1 * | 3/2003 | Koscielniak et al. | 250/214.1 |
| 6,894,322 B2 | 5/2005 | Kwan et al. | |
| 6,946,715 B2 | 9/2005 | Hong | |
| 7,129,466 B2 * | 10/2006 | Iwasaki | 250/214.1 |
| 7,154,157 B2 * | 12/2006 | Bradski et al. | 257/440 |
| 7,166,880 B2 | 1/2007 | Merrill et al. | |
| 2004/0178464 A1 * | 9/2004 | Merrill et al. | 257/440 |
| 2006/0008937 A1 * | 1/2006 | Blanchard et al. | 438/57 |
| 2006/0054987 A1 | 3/2006 | Nii | |
| 2006/0145176 A1 * | 7/2006 | Lee | 257/98 |
| 2006/0145216 A1 * | 7/2006 | Lee | 257/294 |
| 2007/0076108 A1 * | 4/2007 | Misawa | 348/294 |
| 2007/0120045 A1 * | 5/2007 | Yokoyama | 250/214 R |
| 2007/0187793 A1 * | 8/2007 | Moon et al. | 257/440 |
| 2007/0207566 A1 * | 9/2007 | Fu et al. | 438/64 |
| 2007/0215921 A1 * | 9/2007 | Hsu et al. | 257/290 |
| 2008/0061391 A1 * | 3/2008 | Bang | 257/432 |
| 2008/0116537 A1 * | 5/2008 | Adkisson et al. | 257/448 |

* cited by examiner

*Primary Examiner* — Wael Fahmy
*Assistant Examiner* — Sarah Salerno
(74) *Attorney, Agent, or Firm* — Blakely Sokoloff Taylor & Zafman LLP

(57) ABSTRACT

A backside illuminated imaging sensor includes a vertical stacked sensor that reduces cross talk by using different silicon layers to form photodiodes at separate levels within a stack (or separate stacks) to detect different colors. Blue light-, green light-, and red light-detection silicon layers are formed, with the blue light detection layer positioned closest to the backside of the sensor and the red light detection layer positioned farthest from the backside of the sensor. An antireflective coating (ARC) layer can be inserted in between the red and green light detection layers to reduce the optical cross talk captured by the red light detection layer. Amorphous polysilicon can be used to form the red light detection layer to boost the efficiency of detecting red light.

12 Claims, 4 Drawing Sheets

BACKSIDE ILLUMINATED IMAGING SENSOR WITH VERTICAL PIXEL SENSOR

CROSS-REFERENCE TO RELATED APPLICATION

This application claims the priority of the Provisional U.S. Patent Application 61/027,373 filed Feb. 8, 2008.

TECHNICAL FIELD

This disclosure relates generally to imaging sensors, and in particular but not exclusively, relates to backside illuminated imaging sensors.

BACKGROUND INFORMATION

Many semiconductor imaging sensors today are frontside illuminated. That is, they include imaging arrays that are fabricated on the frontside of a semiconductor wafer, where light is received at the imaging array from the same frontside. However, frontside illuminated imaging sensors have many drawbacks, one of which is a relatively limited fill factor.

Backside illuminated imaging sensors are an alternative to frontside illuminated imaging sensors and address the fill factor problems associated with frontside illumination. Backside illuminated imaging sensors typically include imaging arrays that are fabricated on the front surface (or frontside) of the semiconductor wafer, but receive light through a back surface of the wafer. However, to detect light from the backside, the silicon wafer on the backside is relatively thin. Color filters and micro-lenses can be included on the back surface of the wafer in order to improve the sensitivity of the backside illuminated sensor. The thickness of the wafer may also be reduced in order to improve the sensitivity to light (especially lower wavelengths). However, higher sensitivity typically results in higher optical crosstalk. That is, as the semiconductor wafer is thinned, light can more easily pass through the wafer and light intended for one pixel might be reflected within the image sensor to other pixels that were not intended to receive the light. Thus, improving sensitivity and reducing optical crosstalk can improve the signal quality of a backside illuminated sensor.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Figure 1:
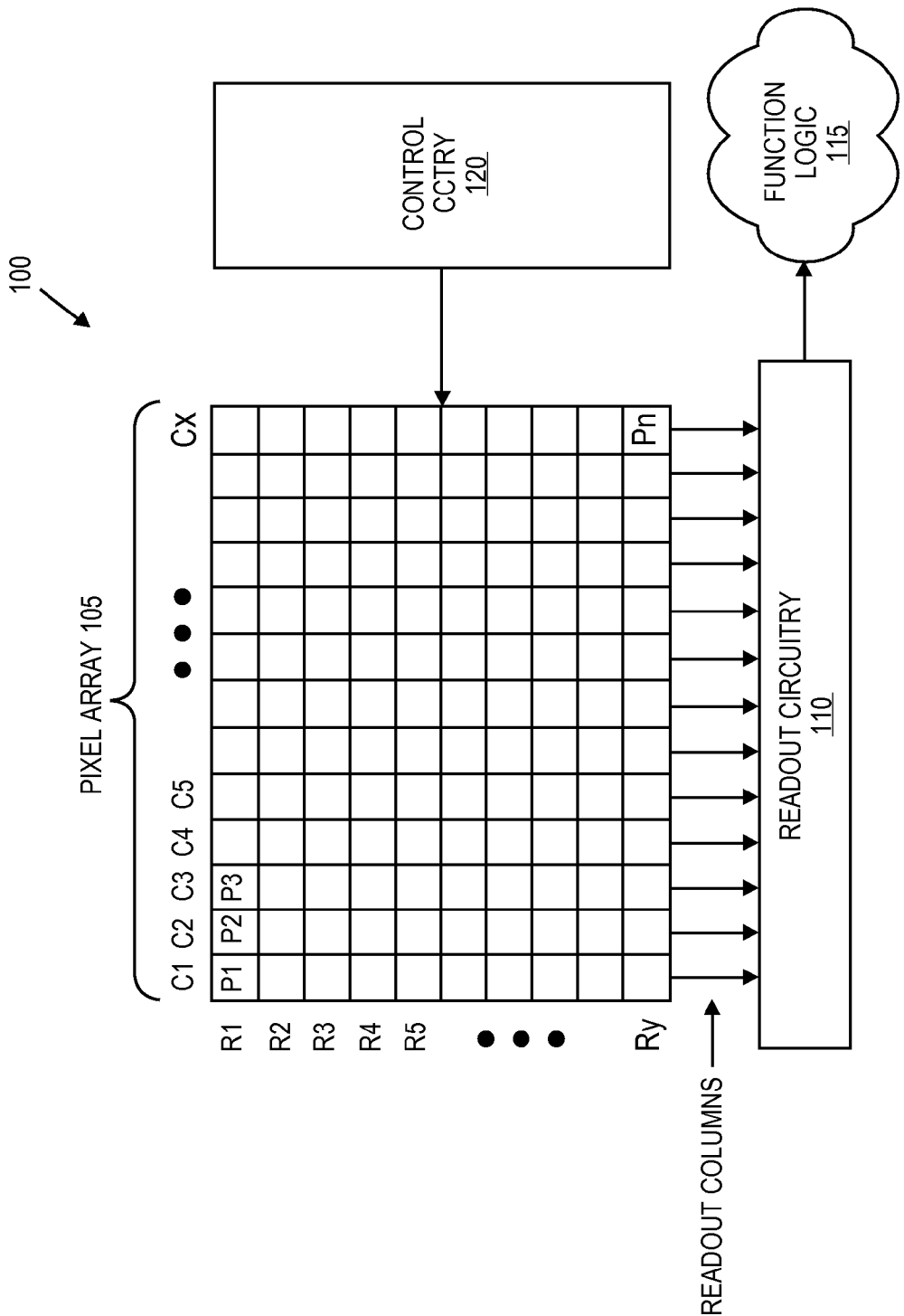
FIG. 1 is a block diagram illustrating a backside illuminated imaging sensor, in accordance with an embodiment of the invention.

Embodiments of a Backside Illuminated Imaging Sensor with Vertical Pixel Sensors are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As the pixel-size of CMOS image sensors become smaller the active area of the photodiode also becomes smaller. The fill factor (the ratio of the light sensitive area of a pixel to the non-light sensitive area of the pixel) reduces due to circuitry that is used to readout the pixel. One method to improve the fill factor ratio is to use backside illumination.

In typical CMOS image sensors, active pixel sensors use red, green, and blue sensors that are disposed horizontally in a pattern at or near the semiconductor surface. Color overlay filters are used to produce the color selectivity between the red, green, and blue sensors. However, the filtered sensors have the disadvantage of occupying a relatively large area per pixel as these sensors are tiled together in a plane.

The different sensors for the colors can be placed at different depths of pixel because red, green, and blue wavelengths of light can be absorbed in silicon at different depths. The light is absorbed when photons produce electrons that are captured by the pixel. Longer wavelengths are more typically absorbed at deeper depths in silicon. Using this principle, various vertical pixel sensor groups are proposed in different patents, such as U.S. Pat. Nos. 5,965,875, 6,894,322 and 7,166,880.

However, colors cannot be completely separated and discerned by the stacked photoconversion regions (such as semiconductor junctions), even when they are placed at optimal depths based on light wavelength. Accordingly, the incomplete color separation results in "cross talk" between adjacent color detection regions and poor quantum efficiency.

To address the cross talk issue, two pixels can be used: one pixel having blue and red in one stack while a separate pixel can include a green sensor as in U.S. Pat. No. 6,946,715.

Another problem related to the stacked pixel sensor group is that when the red detector is placed deeper in silicon, a higher implant energy is used to form such deep junction. The higher implant energy tends to cause the implanted ions to spread ("straggle") at deeper depths, which presents process challenges as the design rules become more strict.

In accordance with the present disclosure, a BSI vertical stacked sensor reduces cross talk by using different silicon layers to form photodiodes at separate levels within a stack to detect different colors. Blue light-, green light-, and red light-detection silicon layers are formed, with the blue light detection layer positioned closest to the backside surface of the sensor and the red light detection layer positioned farthest from the backside of the sensor. An anti-reflective coating (ARC) layer can be inserted in between the red and green light detection layers to reduce the optical cross talk captured by the red light detection layer. The thickness and type of the ARC layer can be varied to reflect (or pass through) light of selected wavelengths. One or more ARC layers can be used to reflect one or more selected wavelengths of light, which filters the light that passes through the ARC. Amorphous polysilicon can be used to form the red light detection layer to boost the efficiency of detecting red light.

FIG. 1 is a block diagram illustrating a backside illuminated imaging sensor 100, in accordance with an embodiment of the invention. The illustrated embodiment of imaging sensor 100 includes a pixel array 105, readout circuitry 110, function logic 115, and control circuitry 120.

Pixel array 105 is a two-dimensional ("2D") array of backside illuminated imaging sensors or pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 110 and transferred to function logic 115. Readout circuitry 110 may include amplification circuitry, analog-to-digital conversion circuitry, or otherwise. Function logic 115 may simply store the image data or even manipulate by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristic of pixel array 105. For example, control circuitry 120 may generate a shutter signal for controlling image acquisition.

Figure 2:
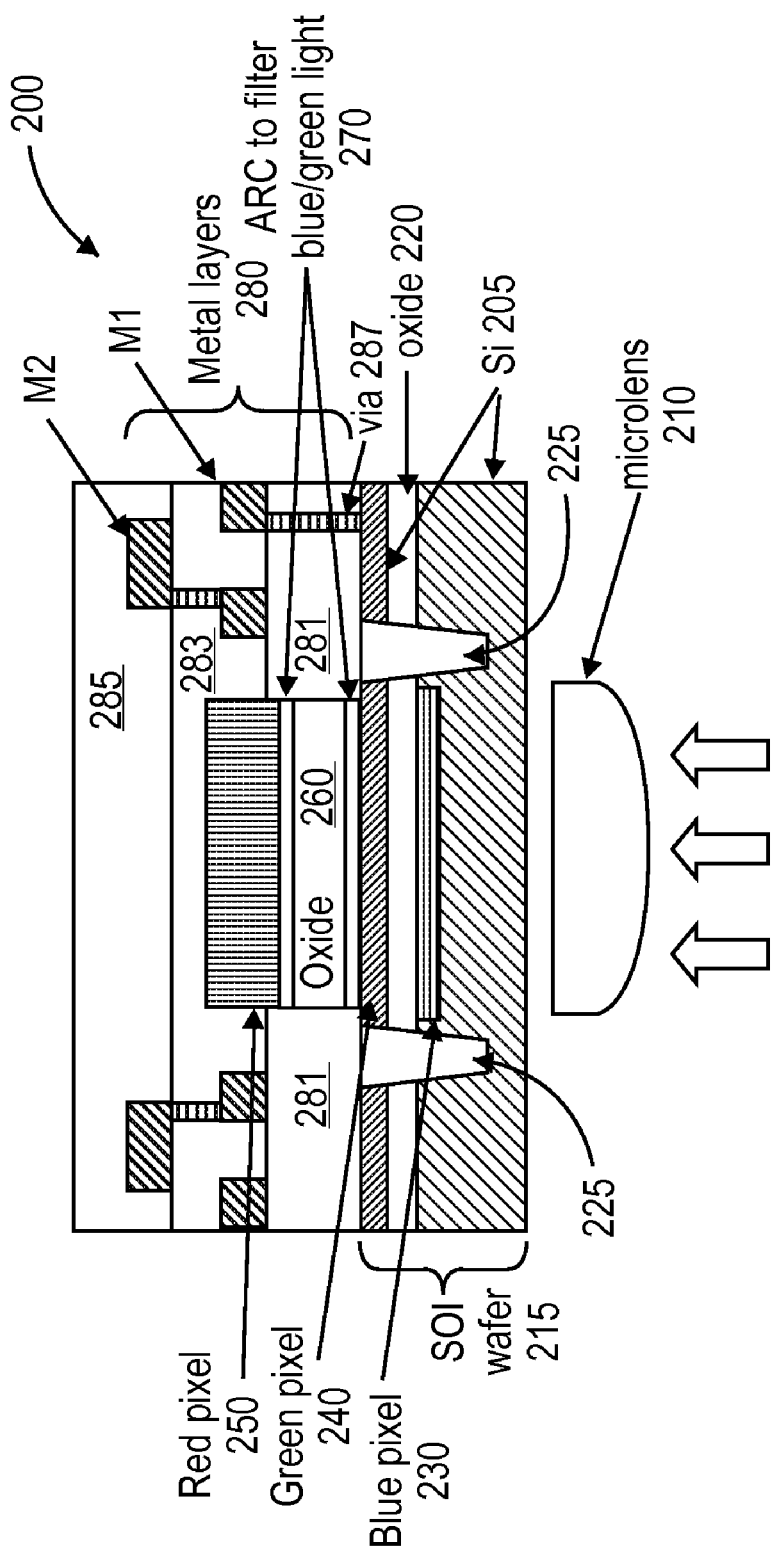
FIG. 2 is a cross-sectional view of a vertical pixel sensor of a backside illuminated imaging sensor.

FIG. 2 is a cross-sectional view of a vertical pixel sensor 200 of a backside illuminated imaging sensor. The illustrated embodiment of imaging pixel 200 includes a semiconductor substrate 205 that includes shallow trench isolations ("STI") 225 and stacked pixels: blue pixel 230, green pixel 240, and red pixel 250. A microlens 210 is provided at the backside of the sensor to help focus incident light upon the stacked pixels.

As illustrated in FIG. 2 the blue and green pixels can be formed on an SOI (silicon on insulator) substrate 215, having an insulator (oxide) layer 220. Blue pixel 230 is formed in the silicon under the buried oxide while green pixel 240 is formed in the silicon on the top of buried oxide layer 220. Because the photodiode is separated by the buried oxide, electronic cross talk is substantially reduced.

An amorphous silicon layer can be used to form the red pixel 250. Amorphous silicon is used for the red pixel because amorphous silicon has good absorption for longer wavelengths of light as compared to single crystalline silicon. Generally, deposition of amorphous silicon layer requires temperatures below 500~600 C to prevent re-crystallization of the silicon. Thus, later process steps are held below this temperature. Accordingly, the amorphous silicon layer can be deposited using backend processing steps to ensure that no re-crystallization of the amorphous silicon occurs. This amorphous layer can be deposited in between metal layers or after all metal layers are formed.

An oxide layer 260 can be formed between the red and green pixels. A layer 270 of ARC can be placed on the frontside and/or backside of oxide layer 260. The ARC does not transmit the blue and green light that has not been absorbed by the layers below the ARC so that optical cross talk (e.g., blue and green light being detected as red light) is reduced.

Because the red pixel is separated from green photodiode by an oxide layer, no electronic cross talk can happen. Photosensitive regions such as red pixel 250 and blue pixel 230 (as well as green pixel 240) can be coupled to circuits for processing using metal layers 280 and vias 287, for example. Metal layers 280 comprise metal layers such as M1 and M2, which can be comprised dielectric layers 281, 283 and 285.

Figure 3:
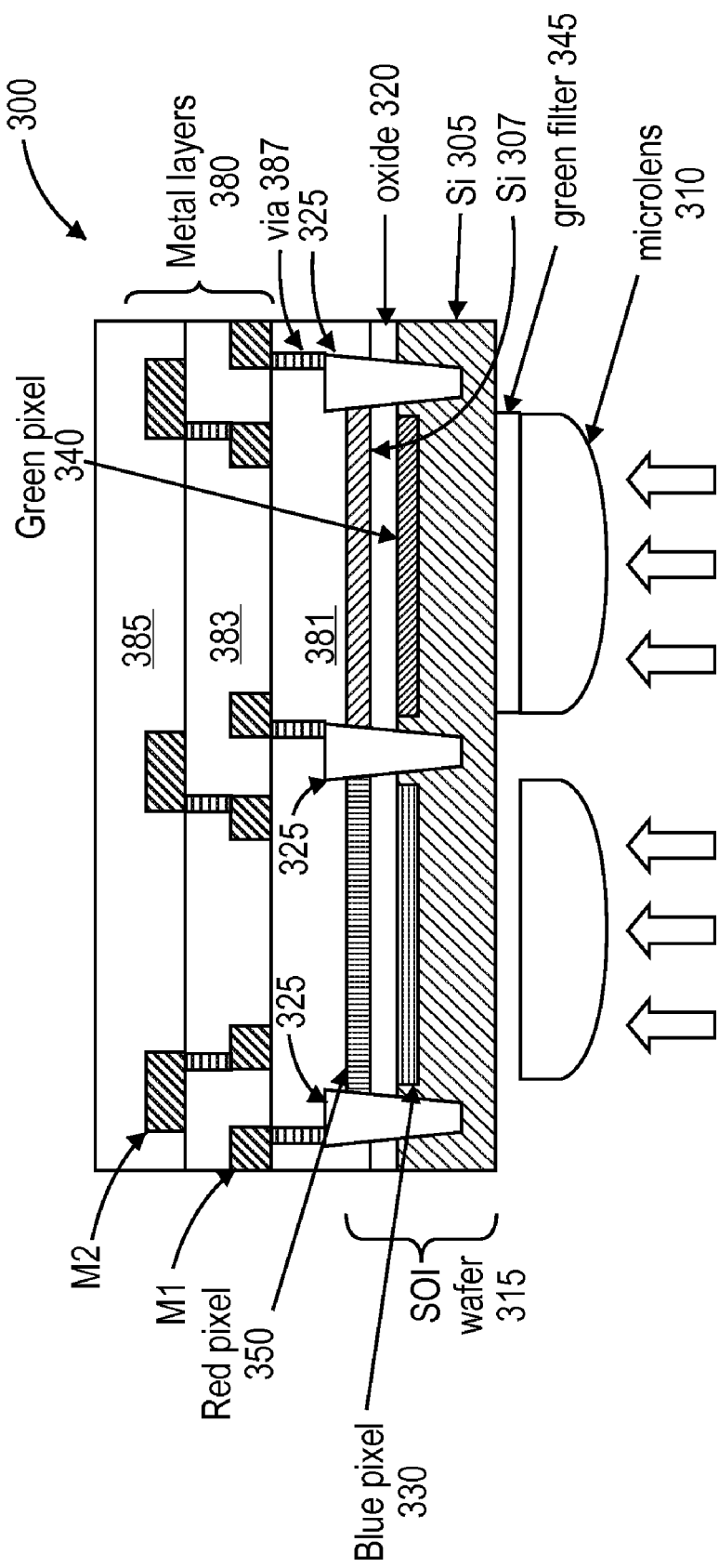
FIG. 3 is a cross-sectional view of another embodiment of a vertical pixel sensor of a backside illuminated imaging sensor.

FIG. 3 is a cross-sectional view of another vertical pixel sensor 300 of a backside illuminated imaging sensor. The illustrated embodiment of imaging pixel 300 includes a semiconductor substrate 305 that includes shallow trench isolations ("STI") 325 and stacked pixels: blue pixel 330, and red pixel 350. A separate stack includes green pixel 340. A microlens 310 is provided at the backside of the sensor to help focus incident light upon each set of stacked pixels. A green (pass) filter 345 can optionally be used to reduce optical cross talk captured by green pixel 340.

As illustrated in FIG. 3 the blue, green, and red pixels can be formed on an SOI (silicon on insulator) substrate 315, having an insulator (oxide) layer 320. An amorphous silicon layer of the SOI substrate can be used to form the red pixel 350. An epitaxial layer of silicon can be grown on the SOI substrate to form the red pixel and silicon layer 307. An oxide layer (not shown for simplicity) can be formed between frontside metal layers 380 and the pixels. Photosensitive regions such as red pixel 350 can be coupled to circuits for processing using metal layers 380 and vias 387, for example. Metal layers 380 comprise metal layers such as M1 and M2, which can be comprised by dielectric layers 381, 383 and 385.

Figure 4:
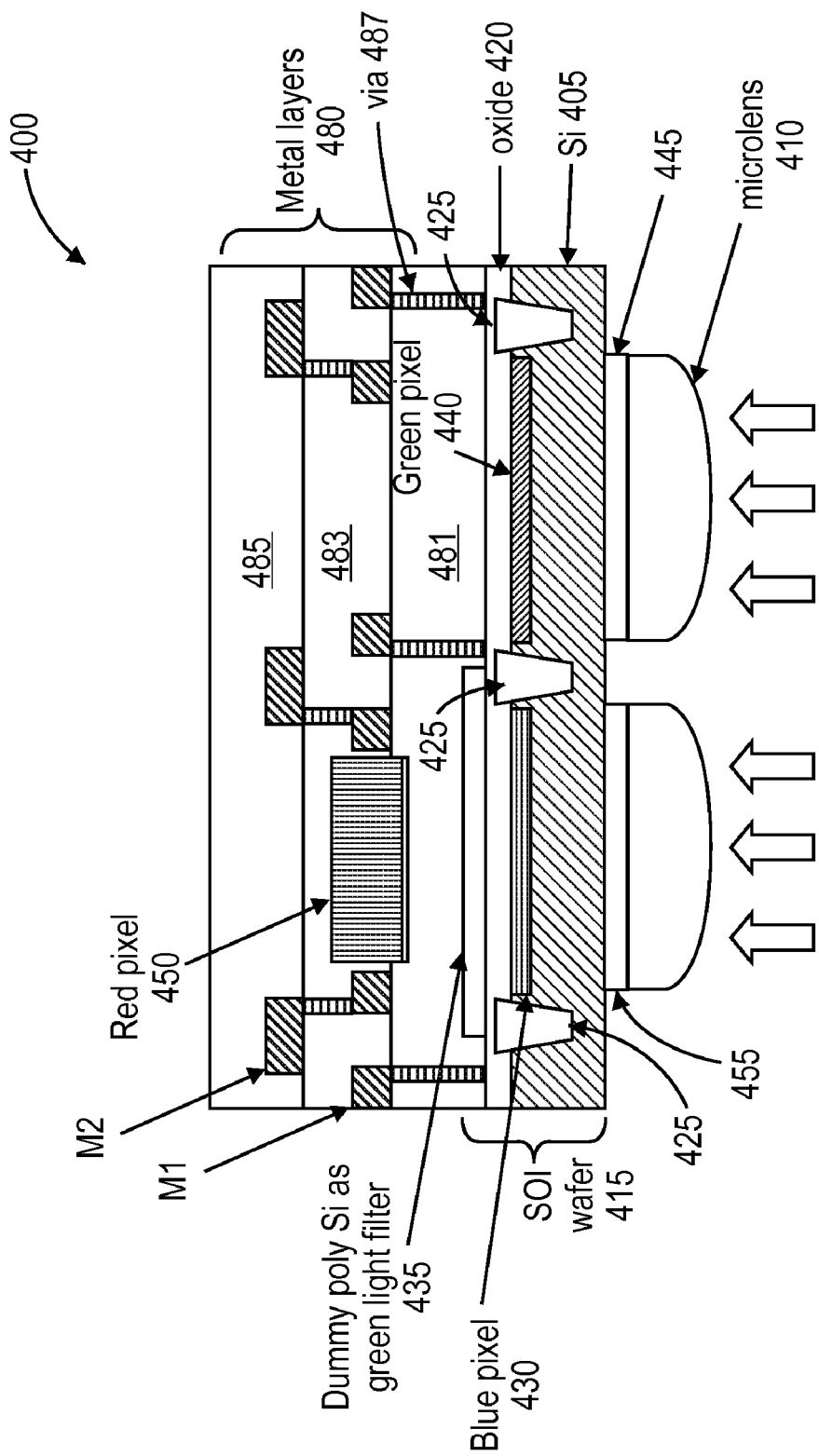
FIG. 4 is a cross-sectional view of yet another embodiment of a vertical pixel sensor of a backside illuminated imaging sensor.

FIG. 4 is a cross-sectional view of yet another vertical pixel sensor 400 of a backside illuminated imaging sensor. The illustrated embodiment of imaging pixel 400 includes a semiconductor substrate 405 that includes shallow trench isolations ("STI") 425, blue pixel 430, and green pixel 440. Red pixel 450 is provided in metal layers 480. "Dummy" polysilicon 435 can be provided as a green light (stop) filter. A separate microlens 410 is provided at the backside of the sensor to help focus incident light upon each set of stacked pixels. A green (pass) filter 445 can optionally be used to reduce optical cross talk captured by green pixel 440. A magenta (pass) filter 455 can optionally be used to reduce optical cross talk captured by red pixel 450 and blue pixel 430.

As illustrated in FIG. 4 the blue, green, and red pixels can be formed on a silicon substrate 415 (or SOI), having an insulator (oxide) layer 420. An amorphous silicon layer can be used to form the red pixel 450. An oxide layer (not shown for simplicity) can be formed between frontside metal layer 480 and the pixels. Photosensitive regions such as red pixel 450 can be coupled to circuits for processing using metal layers 480 and vias 487, for example. Metal layers 480 comprise metal layers such as M1 and M2, which can be comprised by dielectric layers 481, 483 and 485.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A backside illuminated imaging sensor, comprising:
   a semiconductor substrate having a frontside and a backside;
   a red pixel, a blue pixel, and a green pixel, wherein the blue and green pixels are disposed in the semiconductor substrate and the red pixel is disposed above the frontside of the semiconductor substrate;
   an oxide layer disposed between the red pixel and the green pixel; and
   a microlens disposed under the backside of the semiconductor substrate to direct light incident upon the backside towards the blue pixel,
   wherein the red, green, and blue pixels are all stacked in alignment with the microlens such that the light incident upon the backside and directed by the microlens passes through the blue and green pixels within the semiconductor substrate before reaching the red pixel.

2. The sensor of claim 1, wherein the green pixel is positioned between the red and blue pixels.

3. The sensor of claim 1, further comprising an antireflective coating between the oxide layer and the green pixel.

4. The sensor of claim 1, further comprising an antireflective coating between the oxide layer and the red pixel.

5. The sensor of claim 1, wherein the semiconductor substrate is a silicon on insulator substrate.

6. The sensor of claim 5, wherein the silicon on insulator substrate comprises:
   a first silicon layer;
   a second silicon layer; and
   an insulator layer disposed between the first and second silicon layers,
   wherein the blue pixel is disposed within the first silicon layer,
   wherein the green pixel is disposed within the second silicon layer and electrically insulated from the blue pixel by the insulator layer of the silicon on insulator substrate.

7. The sensor of claim 1, wherein the red pixel is formed using amorphous silicon.

8. The sensor of claim 1, further comprising:
   a metal stack disposed over the frontside of the semiconductor substrate, the metal stack including metal layers and dielectric layers to insulate the metal layers,
   wherein the red pixel is disposed within the metal stack.

9. The sensor of claim 1, further comprising:
   a filter disposed between the red pixel and the green pixel to filter at least one of blue or green light from reaching the red pixel.

10. The sensor of claim 9, wherein the filter is disposed above the frontside of semiconductor substrate.

11. A method of operation of a backside illuminated complementary metal-oxide-semiconductor ("CMOS") imaging sensor including a plurality of pixels in a pixel array, the method comprising:
    directing incident light through a first microlens disposed on a backside of a semiconductor substrate to provide focused incident light;
    passing the focused incident light through a blue pixel disposed within the semiconductor substrate to absorb blue wavelengths of light;
    passing light from the blue pixel through a green pixel disposed within the semiconductor substrate to absorb green wavelengths of light;
    passing light from the green pixel through an oxide layer disposed between the green pixel and a red pixel to reduce electronic cross talk between the green pixel and the red pixel; and
    passing light from the oxide layer through the red pixel to absorb red wavelengths of light, wherein the red pixel is disposed within a metal stack of metal layers and dielectric layers, the metal stack disposed over a frontside of the semiconductor substrate.

12. The method of claim 11, wherein the red pixel uses amorphous silicon to absorb the red wavelengths of light.

* * * * *